United States Patent
Pan et al.

(10) Patent No.: US 12,079,550 B1
(45) Date of Patent: Sep. 3, 2024

(54) WIENER PROCESS-BASED METHOD AND DEVICE FOR PROCESSING ACCELERATED DEGRADATION TESTING DATA

(71) Applicant: China Electronic Product Reliability and Environmental Testing Research Institute (The Fifth Electronic Research Institute of Ministry of Industry and Information Technology) (CEPREI), Guangzhou (CN)

(72) Inventors: Guangze Pan, Guangzhou (CN); Xiaojian Ding, Guangzhou (CN); Bochen Chen, Guangzhou (CN); Dan Li, Guangzhou (CN); Lijun Sun, Guangzhou (CN); Wenwei Liu, Guangzhou (CN); Chengju Dong, Guangzhou (CN); Guangkuo Guo, Guangzhou (CN)

(73) Assignee: China Electronic Product Reliability and Environmental Testing Research Institute (The Fifth Electronic Research Institute of Ministry of Industry and Information Technology) (CEPREI) (CN)

( * ) Notice: Subject to any disclaimer, the term of this patent is extended or adjusted under 35 U.S.C. 154(b) by 0 days.

(21) Appl. No.: 18/434,051

(22) Filed: Feb. 6, 2024

(51) Int. Cl.
    *G06F 30/20* (2020.01)
(52) U.S. Cl.
    CPC .................. *G06F 30/20* (2020.01)

(58) Field of Classification Search
    CPC ...................................................... G06F 30/20
    See application file for complete search history.

(56) References Cited

U.S. PATENT DOCUMENTS

2019/0272354 A1* 9/2019 Huang .................... G06F 30/20

FOREIGN PATENT DOCUMENTS

| CN | 101620045 A | 1/2010 | |
|---|---|---|---|
| CN | 109657937 A | 4/2019 | |
| CN | 111814301 A * | 10/2020 | ............ G06F 30/20 |
| CN | 113486455 A | 10/2021 | |

(Continued)

OTHER PUBLICATIONS

Pan G, Li X, Li Y, Li D, Wang C. Statistical analysis method for accelerated life testing with incomplete data and competing failure modes. Microelectronics Reliability. Nov. 1, 2021;126:114248. (Year: 2021).*

(Continued)

*Primary Examiner* — Chuen-Meei Gan
(74) *Attorney, Agent, or Firm* — Polsinelli PC

(57) ABSTRACT

A method for processing accelerated degradation test data based on Wiener process includes obtaining accelerated degradation test data of a to-be-tested product, selecting a target time conversion model from a predefined set of time conversion models based on the accelerated degradation test data, constructing a nonlinear Wiener degradation process based on the target time conversion model, determining a product reliability function of the to-be-tested product, and testing the reliabilities of the to-be-tested product based on the product reliability function to obtain product reliability test results of the to-be-tested products.

11 Claims, 6 Drawing Sheets

(56) References Cited

FOREIGN PATENT DOCUMENTS

CN          115618575 A  *  1/2023  ............. G06F 30/20

OTHER PUBLICATIONS

Kong et al., "Statistical Analysis of Ball Screw Mechanism Based on an Accelerated Degradation Test," Journal of Beijing University of Technology (Nov. 2017); 43(11):1629-1634.
Tsai et al., "Mis-specification analyses of gamma and Wiener degradation processes," Journal of Statistical Planning and INference (2011); 141:3725-3735.
Bingliang et al., "Reliability Assessment Approach for Wiener-type Degradation Based on Acceleration Factor," Tactical Missile Technology (2017); DOI: 10.16358/j.issn. 1009-1300; pp. 25-30.
Office Action issued on Mar. 3, 2023 for corresponding CN Application No. 202310094910.X (14 pages).
Decision to Grant issued on May 2, 2023 for corresponding CN Application No. 202310094910.X (6 pages).

\* cited by examiner

WIENER PROCESS-BASED METHOD AND DEVICE FOR PROCESSING ACCELERATED DEGRADATION TESTING DATA

CROSS-REFERENCE TO RELATED APPLICATIONS

This application claims the priority to Chinese patent application No. 202310094910X, filed on Feb. 10, 2023, which is hereby incorporated by reference in its entirety.

TECHNICAL FIELD

This disclosure relates to the field of accelerated degradation tests, and particularly to a method and device for processing accelerated degradation test data based on Wiener process, a computer device, and a storage medium.

BACKGROUND

Accelerated degradation tests are used to accelerate the degradation of product performance over time under more stringent stress conditions than those for normal use while keeping the failure mechanism unchanged, and collect the accelerated degradation data for the products. Through statistical inference and extrapolation, it enables a rapid test and estimation of product reliability and life.

SUMMARY

The first aspect of the present disclosure provides a method for processing accelerated degradation test data based on Wiener process, including: obtaining accelerated degradation test data of to-be-tested products, the accelerated degradation test data including multiple accelerated degradation test stresses; determining time conversion factors of each to-be-tested product based on the accelerated degradation test data, transforming time conversion models in a predefined set of time conversion models into nonlinear optimization equations based on the time conversion factors, estimating model parameters of each time conversion model, determining the time conversion models based on the model parameters, performing model validations for the time conversion models based on the time conversion factors of the to-be-tested products and preset conversion factor validation thresholds, and selecting a target time conversion model from the time conversion models based on the model validation results, the target time conversion model representing a pattern of performance degradation over time; constructing a nonlinear Wiener degradation process based on the target time conversion model, and determining a product reliability function for the to-be-tested products based on the nonlinear Wiener degradation process; and testing reliabilities of the to-be-tested products based on the product reliability function, and obtaining product reliability test results of the to-be-tested products.

In some embodiments, constructing the nonlinear Wiener degradation process based on the target time conversion model, and determining the product reliability function for the to-be-tested product based on the nonlinear Wiener degradation process includes constructing an initial nonlinear Wiener process based on the target time conversion model, constructing an initial product reliability function based on the initial nonlinear Wiener process, and estimating nonlinear Wiener process parameters of the initial product reliability function to determine the product reliability function for the to-be-tested products.

In some embodiments, estimating the nonlinear Wiener process parameters of the initial product reliability function to determine the product reliability function for the to-be-tested products includes obtaining a failure probability density function of the to-be-tested products based on the initial product reliability function, and estimating the nonlinear Wiener process parameters of the initial product reliability function based on a pre-constructed maximum likelihood function of performance degradation, the initial product reliability function and the failure probability density function to determine the product reliability function for the to-be-tested product.

In some embodiments, the product reliability test result includes a first mean time between failures and a second mean time between failures, and the accelerated degradation test data includes multiple accelerated degradation test stresses. Testing the reliabilities of the to-be-tested products based on the product reliability function, and obtaining the product reliability test results of the to-be-tested products includes: testing the reliability of each to-be-tested product under the multiple accelerated degradation test stresses based on the product reliability function, obtaining the first mean time between failures of the to-be-tested product, and obtaining the second mean time between failures of the to-be-tested product under a normal stress based on the first mean time between failures and an acceleration factor corresponding to a target accelerated degradation test stress.

In some embodiments, selecting the target time conversion model from the time conversion models based on the model validation results includes selecting initial time conversion models from the time conversion models based on the model validation results, and selecting the target time conversion model from the initial time conversion models based on time conversion factors corresponding to the initial time conversion models.

The second aspect of the present disclosure provides a device for processing accelerated degradation test data based on Wiener process, including: a data obtaining module configured to obtain accelerated degradation test data of to-be-tested products, the accelerated degradation test data including multiple accelerated degradation test stresses; a time conversion model selecting module configured to determine time conversion factors of each to-be-tested product based on the accelerated degradation test data, transform time conversion models in a predefined set of time conversion models into nonlinear optimization equations based on the time conversion factors, estimate model parameters of each time conversion model, determining the time conversion models based on the model parameters, perform model validations for the time conversion models based on the conversion factors of the to-be-tested products and preset conversion factor validation thresholds, and select a target time conversion model from the time conversion models based on the model validation results, the target time conversion model representing a pattern of performance degradation over time; a product reliability function determination module configured to construct a nonlinear Wiener process based on the target time conversion model and determine a product reliability function for the to-be-tested products based on the nonlinear Wiener degradation process; and a product reliability test module configured to test reliabilities of the to-be-tested products based on the product reliability function and obtain product reliability test results of the to-be-tested products.

In some embodiments, the product reliability function determination module is configured to construct an initial nonlinear Wiener process based on the target time conversion model, construct an initial product reliability function based on the initial nonlinear Wiener process, and estimate nonlinear Wiener process parameters of the initial product reliability function to determine the product reliability function for the to-be-tested products.

In some embodiments, the product reliability function determination module is further configured to obtain a failure probability density function of the to-be-tested products based on the initial product reliability function, and estimate the nonlinear Wiener process parameters of the initial product reliability function based on a pre-constructed maximum likelihood function of performance degradation, the initial product reliability function and the failure probability density function to determine the product reliability function for the to-be-tested products.

The third aspect of the present disclosure provides a computer device including a memory and a processor. The memory stores a computer program. The processor, when executing the computer program, carries out steps of the method for processing accelerated degradation test data based on Wiener process according to any one of the above-described embodiments.

The fourth aspect of the present disclosure provides a non-transitory computer readable storage medium having a computer program stored thereon. The computer program, when executed by a processor, causes the processor to carry out steps of the method for processing accelerated degradation test data based on Wiener process according to any one of the above-described embodiments.

DETAILED DESCRIPTION

In order to provide a clearer and more detailed explanation of the purpose, technical solution, and advantages of the present disclosure, specific embodiments will be described below in conjunction with the accompanying drawings. It should be understood that the description of the specific embodiments provided herein is for the purpose of explaining the present disclosure and is not intended to limit the scope of the present disclosure.

As known to the inventors, common methods for analyzing accelerated degradation test data use linear Wiener processes, which have the advantages of simplicity and ease of computation. A few methods consider the nonlinearity of product performance degradation and use specific models to convert performance degradation time, thereby improving the accuracy of reliability estimation to some extent.

However, the above methods only consider linear performance degradation, which is suitable for cases where product performance degradation over time follows a linear function, resulting in relatively low testing accuracy.

Therefore, there is a need to provide a method for accurately testing product reliability.

Figure 1:
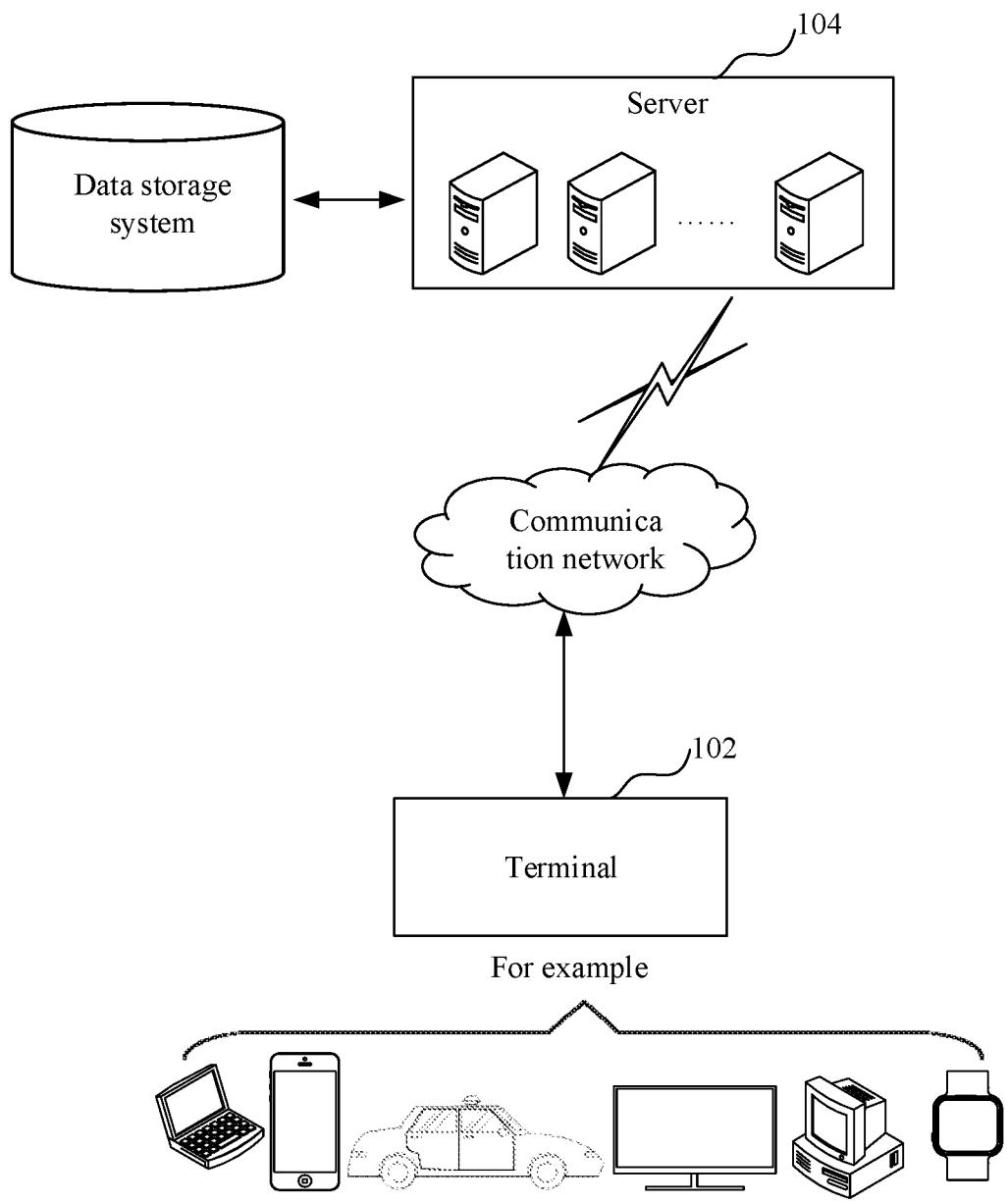
FIG. 1 shows an application environment for a method for processing accelerated degradation test data based on Wiener process according to an embodiment.

The method for processing accelerated degradation test data based on Wiener process according to embodiments of the present disclosure can be applied in the application environment as shown in FIG. 1. In this environment, a user terminal 102 communicates with a server 104 via a network. Specifically, the testing staff can upload the accelerated degradation test data of the to-be-tested product to the server 104 through the user terminal 102 and send a product reliability test message to the server 104. The server 104 responds to the message by retrieving the accelerated degradation test data of the to-be-tested product. Then, based on the accelerated degradation test data, the server selects a target time conversion model from a predefined set of time conversion models. Based on the selected target time conversion model, a nonlinear Wiener degradation process is constructed to determine the product reliability function of the to-be-tested product. Finally, based on the product reliability function, the reliability of the to-be-tested product is tested to obtain a product reliability test result. The user terminal 102 can be, but not limited to, various personal computers, laptops, smartphones, tablets, and portable wearable devices. The server 104 can be implemented as an independent server or a server cluster composed of multiple servers.

Figure 2:
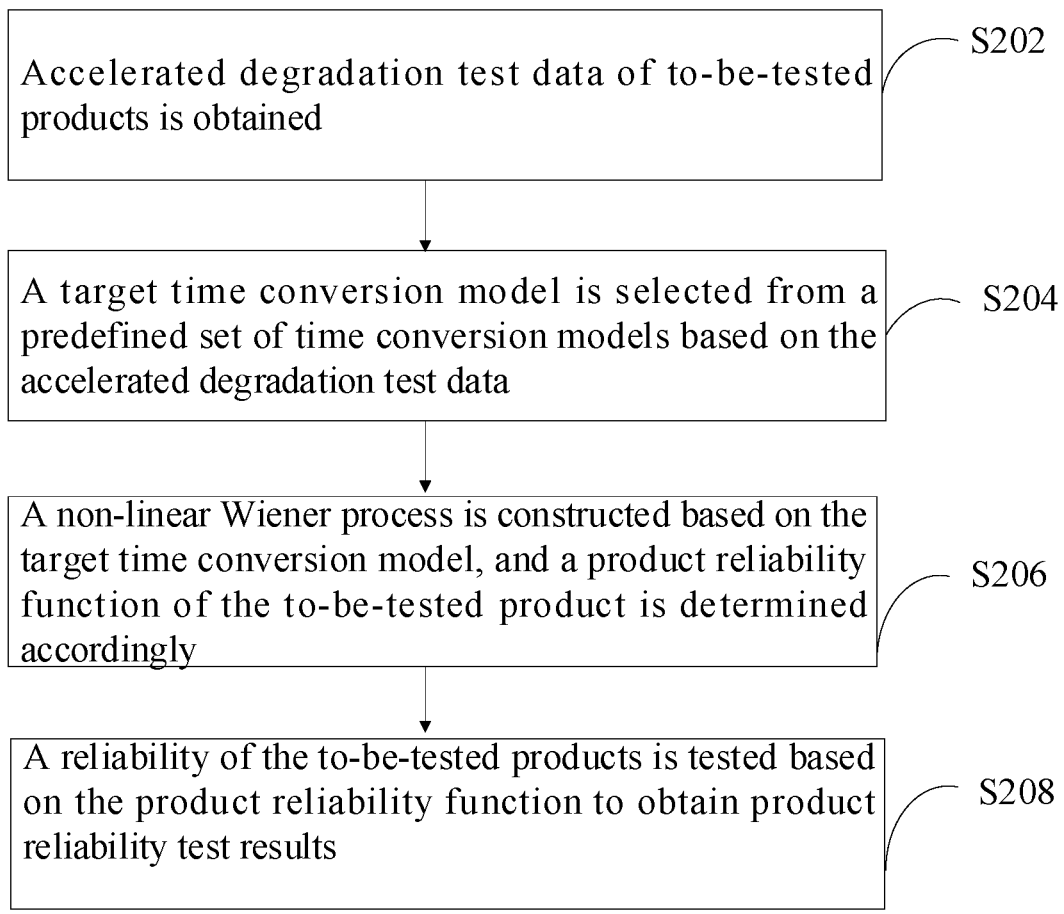
FIG. 2 is a schematic flowchart of a method for processing accelerated degradation test data based on Wiener process according to an embodiment.

In an embodiment as shown in FIG. 2, a method for processing accelerated degradation test data based on Wiener process is provided. Taking the application of the method to the user terminal 102 in FIG. 1 as an example, the method includes the following steps S202-S208.

In step S202, accelerated degradation test data of the to-be-tested products is obtained.

The to-be-tested product may be an electronic device or a component, such as a photovoltaic module or a radar module. The accelerated degradation test data includes accelerated degradation test stresses, temperatures for the tests, the number of performance tests, the duration of the test, the performance degradation value of each test, and the quantity of the products.

In step S204, based on the accelerated degradation test data, a target time conversion model is selected from a predefined set of time conversion models.

In some embodiments, the target time conversion model is the optimal time conversion model, i.e., the model that most accurately represents the pattern of performance degradation over time. All time conversion models can be transformed into linear expressions through certain transformations. The set of time conversion models includes multiple pre-constructed linear models of product performance degradation over time. Specifically, the set of time conversion models may include power function models, power multiplied function models, exponential function models, and hybrid models, etc. In this embodiment, under an acceleration stress, the time conversion models for product performance degradation are shown in Table 1 as follows:

TABLE 1

Time conversion models for product performance degradation

| No. | Model | Model expression |
|---|---|---|
| 1 | Model 1 | $\rho(t) = a \times t$ |
| 2 | Model 2 | $\rho(t) = t^a$ |
| 3 | Model 3 | $\rho(t) = e^{axt} - 1$ |
| 4 | Model 4 | $\rho(t) = 1 - e^{axt^b}$ |
| 5 | Model 5 | $\rho(t) = a \times t^b$ |

In the table, $\rho(t)$ represents the time conversion function of the product, t represents the test duration, and a and b are unknown parameters.

In a specific implementation, the target time conversion model can be selected from the predefined set of time conversion models based on a time conversion factor of the to-be-tested product. The time conversion factor represents the degree of linear fitting of performance degradation over time.

In step S206, based on the target time conversion model, a non-linear Wiener process is constructed, and a product reliability function for the to-be-tested products is determined accordingly.

The product reliability function is used to quickly estimate the product reliability under normal conditions. Specifically, accelerated tests can be conducted for a product to quickly estimate its reliability. Accelerated test refers to the process of subjecting the to-be-tested product to more stringent test conditions while keeping the failure mechanism of the product unchanged, in order to accelerate the product's failure within a shorter time period and thereby obtain necessary information to estimate the product's reliability or lifespan under normal conditions. The multiple sets of accelerated degradation test stresses may be at different temperatures. Once the target time conversion model is selected, a non-linear Wiener process analysis can be performed based on the target time conversion model to estimate parameters of the non-linear Wiener process and accordingly determine the product reliability function for the to-be-tested products.

In step S208, reliabilities of the to-be-tested products is tested based on the product reliability function to obtain product reliability test results.

Once the product reliability function is determined, the reliability of the to-be-tested product can be tested under different accelerated degradation test conditions using the product reliability function based on the accelerated degradation test data. In this embodiment, the product reliability test result includes a test result of the to-be-tested product under a normal test stress. Specifically, based on a product reliability acceleration model, the failure probability or mean time between failures of the to-be-tested product under a normal stress can be estimated to obtain the product reliability test result.

In the above-described method for processing accelerated degradation test data based on Wiener process, accelerated degradation test data of the to-be-tested products is obtained. Based on the accelerated degradation test data, a target time conversion model is selected from a predefined set of time conversion models. Then, a nonlinear Wiener process is constructed based on the target time conversion model and a product reliability function of the product is determined accordingly. Finally, a reliability of the to-be-tested product is tested based on the product reliability function to obtain a product reliability test result. Firstly, the method considers that degradation time may follow different conversion models and thus conducts a model selection from a set of time conversion models, thereby providing effective support for accurate reliability tests. Secondly, the construction of a nonlinear Wiener process based on the selected target time conversion model takes into account the nonlinearity of performance degradation. Thirdly, the product reliability function determined based on the nonlinear Wiener process allows for accurate reliability tests of the to-be-tested product. In summary, the method enables accurate product reliability tests.

Figure 3:
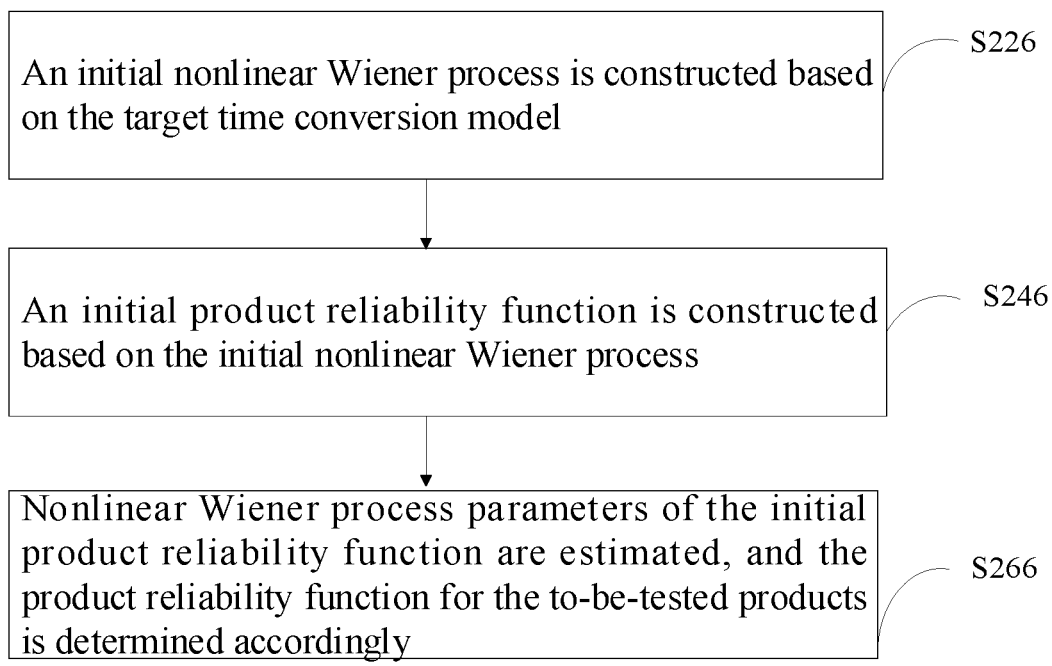
FIG. 3 is a schematic flowchart of steps for determining a product reliability function of a to-be-tested product according to an embodiment.

As shown in FIG. 3, in an embodiment, step S206 includes the following steps S226-S246.

In step S226, an initial nonlinear Wiener process is constructed based on the target time conversion model.

In step S246, an initial product reliability function is constructed based on the initial nonlinear Wiener process.

In step S266, nonlinear Wiener process parameters of the initial product reliability function are estimated and the product reliability function for the to-be-tested products is determined accordingly.

In a specific implementation, it is possible to obtain the nonlinear Wiener process by considering the nonlinearity of performance degradation, uncertainty of degradation amount, and differences in product degradation, as follows:

$$y(t) = \mu \times \rho(t) + \sigma \times Q(\rho(t))$$

where y(t) represents a performance degradation value of the product at time t, $\mu$ and $\sigma$ represent a drift parameter and a diffusion parameter respectively, $Q(\rho(t))$ represents the Brownian drift function, and p follows a normal distribution with mean $\eta$ and variance $\sigma_\eta$.

Further, based on the above nonlinear Wiener process, the initial product reliability function R(t) for the to-be-tested products is constructed by analyzing the test data as follows:

$$R(t) = \Phi\left(\frac{D - \eta\rho(t)}{\sqrt{\sigma^2\rho(t) + \sigma_\eta^2\rho(t)^2}}\right) - \exp\left(\frac{2\eta D\sigma^2 + 2\sigma_\eta^2 D^2}{\sigma^4}\right) \cdot \Phi\left(-\frac{2\sigma_\eta^2 D\rho(t) + \sigma^2(D + \eta\rho(t))}{\sigma^2\sqrt{\sigma^2\rho(t) + \sigma_\eta^2\rho(t)^2}}\right)$$

where D is a failure threshold of product performance degradation.

The nonlinear Wiener process parameters $\eta$, $\sigma_\eta$, and $\sigma$ are unknown at the moment when the construction of the product reliability function is completed. The nonlinear Wiener process parameters can be further estimated to obtain the final product reliability function based on the estimated parameters of the nonlinear Wiener process. In this embodiment, the nonlinear Wiener process is constructed based on the target time conversion model, and the product reliability function can be further quickly constructed and determined based on the nonlinear Wiener process.

In an embodiment, step S266 includes obtaining a failure probability density function of the to-be-tested product based on the initial product reliability function, determining nonlinear Wiener process parameters of the initial product reliability function based on a pre-constructed maximum likelihood function of performance degradation, the initial product reliability function and the failure probability density function, and determining the product reliability function for the to-be-tested products.

In this embodiment, after constructing the initial product reliability function, the nonlinear Wiener process parameters can be solved using the maximum likelihood estimation method. Specifically, the maximum likelihood function of product performance degradation can be pre-constructed. Based on the initial product reliability function, the product failure probability density function g(t) can be obtained as follows:

$$g(t)=[1-R(t)]'.$$

Then, the maximum likelihood function of the product failure probability density function g(t) is obtained as follows:

$$L(\eta,\sigma_\eta,\sigma)=\Pi_{i=1}^n g_i(t).$$

The following equations are created by taking partial derivatives of $\eta$, $\sigma_\eta$, and $\sigma$ respectively:

$$\begin{cases} \dfrac{\partial \ln L}{\partial \eta}=0 \\ \dfrac{\partial \ln L}{\partial \sigma_\eta}=0 \\ \dfrac{\partial \ln L}{\partial \sigma_\eta}=0 \end{cases}.$$

By solving the above system of equations, the nonlinear Wiener process parameters $\eta$, $\sigma_\eta$, and $\sigma$ can be obtained. After determining the nonlinear Wiener process parameters $\eta$, $\sigma_\eta$, and $\sigma$, the product reliability function R(t) can be further determined. In this embodiment, the maximum likelihood method can quickly solve the nonlinear Wiener process parameters.

Figure 4:
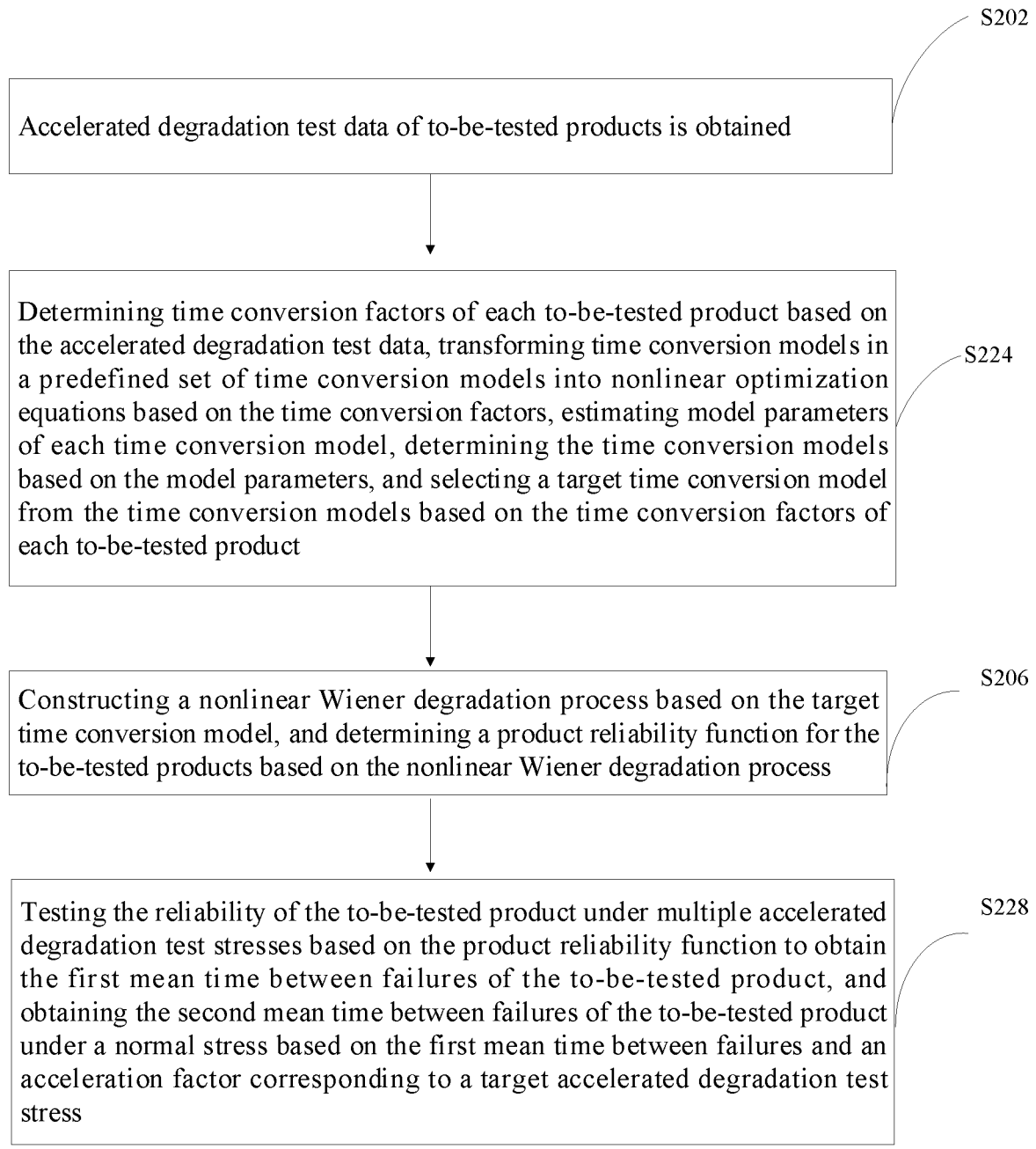
FIG. 4 is a schematic flowchart of a method for processing accelerated degradation test data based on Wiener process according to another embodiment.

As shown in FIG. 4, in an embodiment, the product reliability test result includes a first mean time between failures and a second mean time between failures. The accelerated degradation test data includes multiple accelerated degradation test stresses.

Step S208 includes step S228, in which the reliabilities of the to-be-tested product under multiple accelerated degradation test stresses are tested based on the product reliability function to obtain the first mean time between failures of the to-be-tested product, and the second mean time between failures of the to-be-tested product under a normal stress is obtained based on the first mean time between failures and an acceleration factor corresponding to a target accelerated degradation test stress.

The target accelerated degradation test stress is specified by the test staff for accelerated tests. In practical applications, product reliability tests can be determined based on actual acceleration factors used. Specifically, the acceleration factors include higher frequency power cycling, higher vibration levels, high humidity, and high temperature, etc. In this embodiment, the reliability test result includes a mean time between failures (MTBF) and a product failure probability. The MTBF represents the average time from when a new product starts working under specified operating conditions to the occurrence of the first failure. A longer MTBF indicates better reliability and greater capability of normal operation. The unit of MTBF is hours, reflecting the product's quality over time and the ability to maintain functionality within a specified time period. In this embodiment, the product reliability tests for the to-be-tested products include reliability tests under accelerated degradation test stresses and under normal stresses. Specifically, the reliability tests may include the following items.

a) Estimating the Product Reliability of the to-be-Tested Product Under Accelerated Degradation Test Stresses A failure probability function $\lambda(t)$ of the product under an acceleration stress is as follows:

$$\lambda(t) = -\frac{1}{R(t)} \times \frac{dR(t)}{dt}.$$

The first mean time between failures MTBF of the product under an acceleration stress is as follows:

$$MTBF = \int_0^{+\infty} R(t)dt, \text{ i.e.,}$$

$$MTBF = \int_0^{+\infty} \left\{ \Phi\left(\frac{D-\eta\rho(t)}{\sqrt{\sigma^2\rho(t)+\sigma_\eta^2\rho(t)^2}}\right) - \exp\left(\frac{2\eta D\sigma^2 + 2\sigma_\eta^2 D^2}{\sigma^4}\right) \cdot \Phi\left(-\frac{2\sigma_\eta^2 D\rho(t) + \sigma^2(D+\eta\rho(t))}{\sigma^2\sqrt{\sigma^2\rho(t)+\sigma_\eta^2\rho(t)^2}}\right) \right\} dt.$$

b) Estimation of the Product Reliability Under Normal Stresses

A failure probability function $\lambda_0(t)$ of the product under a normal stress is as follows:

$$\lambda_0(t)=A\times\lambda(t)$$

where A is an acceleration factor of the product under the target accelerated test stress.

The second mean time between failures $MTBF_0$ of the product under a normal stress is obtained as follows:

$$MTBF_0=A\times MTBF.$$

In this embodiment, a new product reliability test method is provided, which combines the acceleration factor and the mean time between failures to test the reliability of the product based on the mean time between failures. This method is concise in form, computationally simple, and balances the computational workload and the accuracy of the test results, making it applicable to a wider range of scenarios.

As shown in FIG. 4, in an embodiment, step S204 includes step S224, in which time conversion factors for each to-be-tested product are determined based on the accelerated degradation test data, the time conversion models in the set of time conversion models are transformed into non-linear optimization equations based on the respective time conversion factors, model parameters of each time conversion model are estimated to determine the time conversion models, and the target time conversion model is selected from the set of time conversion models based on the time conversion factors of the to-be-tested product.

The time conversion factor (hereinafter referred to as conversion factor) can describe the degree of linear fitting of product performance degradation over time. In this embodiment, the selection of the target time conversion model can be achieved by determining the conversion factors of product performance degradation based on the accelerated degradation test data. For example, assuming that there are m products for n accelerated degradation tests and the j-th performance degradation data of the i-th product is represented by $(t_{ij}, y_{ij})$, where i=1, 2, ..., m and j=1, 2, ..., n, then the conversion factor $C_i$ for the performance degradation of the i-th product is as follows:

$$C_i = \frac{\sum_{j=1}^{n}[\rho(t_{ij})\ln y_{ij} - \rho(t_{ij})\ln \bar{y}_i - \overline{\rho(t_i)}\ln y_{ij} + \overline{\rho(t_i)}\ln \bar{y}_i]}{\sqrt{\sum_{j=1}^{n}\{[\rho(t_{ij})]^2 + [\overline{\rho(t_i)}]^2 - 2\rho(t_{ij})\overline{\rho(t_i)}\} \times \sum_{j=1}^{n}\{[\ln y_{ij}]^2 + [\ln \bar{y}_i]^2 - 2\ln y_{ij}\ln \bar{y}_i\}}}$$

where $\rho(t_{ij})$ is the time conversion value corresponding to the time moment $t_{ij}$, $\overline{\rho(t_i)}$ is the average of the values $\rho(t)$ of the i-th product, and $\bar{y}_i$ is the average of the values y of the i-th product.

Thus, the solution of parameters a and b is converted to a constrained nonlinear optimization equation as follows:

$$\max \sum_{i=1}^{m} C_i =$$

$$\sum_{i=1}^{m} \frac{\sum_{j=1}^{n}[\rho(t_{ij})\ln y_{ij} - \rho(t_{ij})\ln \bar{y}_i - \overline{\rho(t_i)}\ln y_{ij} + \overline{\rho(t_i)}\ln \bar{y}_i]}{\sqrt{\sum_{j=1}^{n}\{[\rho(t_{ij})]^2 + [\overline{\rho(t_i)}]^2 - 2\rho(t_{ij})\overline{\rho(t_i)}\} \times \sum_{j=1}^{n}\{[\ln y_{ij}]^2 + [\ln \bar{y}_i]^2 - 2\ln y_{ij}\ln \bar{y}_i\}}}$$

s.t. $0 \le C_i \le 1$

By solving the above equation, the parameters a and b of the time conversion model are obtained, and each time conversion model is determined accordingly.

As an example, the nonlinear optimization equation for Model 5 in Table 1 is as follows:

$$\max \sum_{i=1}^{m} C_i =$$

$$\sum_{i=1}^{m} \frac{\sum_{j=1}^{n}\left[at_{ij}^b \ln y_{ij} - at_{ij}^b \ln \bar{y}_i - \frac{a}{n}\sum_{j=1}^{n} t_{ij}^b \ln y_{ij} + \frac{a}{n}\sum_{j=1}^{n} t_{ij}^b \ln \bar{y}_i\right]}{\sqrt{\sum_{j=1}^{n}\left\{[at_{ij}^b]^2 + \left[\frac{a}{n}\sum_{j=1}^{n} t_{ij}^b\right]^2 - 2at_{ij}^b \frac{a}{n}\sum_{j=1}^{n} t_{ij}^b\right\} \times \sum_{j=1}^{n}\{[\ln y_{ij}]^2 + [\ln \bar{y}_i]^2 - 2\ln y_{ij}\ln \bar{y}_i\}}}$$

s.t. $0 \le C_i \le 1$

By solving this equation, the parameters a and b of Model 5 are obtained, and Model 5 is thus determined.

After determining the time conversion models based on the above-described method, the conversion factors can be used to validate the time conversion models and select the target time conversion model from the initial time conversion models. In this embodiment, based on the conversion factors, it is possible to quickly and easily determine the time conversion models and select, for example, the optimal target time conversion model from the various time conversion models.

In an embodiment, the selection of the target time conversion model from the initial time conversion models based on the conversion factors of each to-be-tested product includes validating the time conversion models based on the respective conversion factors of the to-be-tested product to obtain model validation results, selecting the initial time conversion models from the time conversion models based on the model validation results, and selecting the target time conversion model from the initial time conversion models based on the time conversion factors corresponding to the initial time conversion models.

In this embodiment, the conversion factor can be used to validate the models. In a specific implementation, if the absolute value $|C_i|$ of the conversion factor corresponding to one time conversion model is greater than or equal to $C_L$, then the model passes the validation. If $|C_i|$ is less than $C_L$, then the model fails the validation. $C_L$ represents the conversion factor validation threshold and can be calculated using the following equation:

$$C_L = \sqrt{\frac{[T(\alpha, n-2)]^2}{n - 2 + T(\alpha, (n-2)^2)}}$$

where $\alpha$ is the significance level of the validation and $T(\alpha, n-2)$ is the value of a T distribution function with significance level a and degrees of freedom n−2.

Through the above-mentioned method, the initial time conversion models can be selected from the time conversion models. Then, the target time conversion model can be selected from the initial time conversion models by using the conversion factors corresponding to the respective initial time conversion models. Specifically, it is possibly established that the model with the largest sum of conversion factors $$\sum_{i=1}^{m} C_i$$

is the best model, and the model with the largest sum of conversion factors is selected as the target time conversion model for the accelerated performance degradation test. By validating the models with the conversion factors and then selecting the target time conversion model based on the conversion factors, the objectivity and rationality of the target time conversion model can be fully ensured, and the accuracy of the time conversion model can be improved.

To provide a clearer explanation of the method for processing accelerated degradation test data based on Wiener process provided in this disclosure, a specific embodiment is presented below.

Ten products of a certain type are subjected to accelerated degradation tests under a heat stress at a high temperature of 80° C., and the accelerated degradation test data for the products is shown in Table 2.

TABLE 2

Accelerated degradation test data

| Sample No. | Before test 0 h | The 1st test 168 h | The 2nd test 336 h | ... | The 10th test 1512 h |
|---|---|---|---|---|---|
| 1 | 12.500 | 12.504 | 12.521 | ... | 12.773 |
| 2 | 12.499 | 12.514 | 12.531 | ... | 12.849 |
| 3 | 12.497 | 12.497 | 12.513 | ... | 12.790 |
| 4 | 12.499 | 12.503 | 12.509 | ... | 12.793 |
| 5 | 12.493 | 12.494 | 12.518 | ... | 12.815 |
| 6 | 12.504 | 12.495 | 12.531 | ... | 12.835 |
| 7 | 12.500 | 12.507 | 12.513 | ... | 12.828 |
| 8 | 12.503 | 12.502 | 12.506 | ... | 12.869 |
| 9 | 12.503 | 12.495 | 12.484 | ... | 12.888 |
| 10 | 12.506 | 12.516 | 12.518 | ... | 12.904 | a) Analysis of Time Conversion Model

Parameter estimation, model validation and model selection are performed for the time conversion model.

Taking Model 5 as an example, first, parameter estimation is performed by solving the nonlinear optimization equation:

$$\max \sum_{i=1}^{m} C_i = \sum_{i=1}^{m} \frac{\sum_{j=1}^{n}\left[at_{ij}^{b}\ln y_{ij} - at_{ij}^{b}\overline{\ln}y_i - \frac{a}{n}\sum_{j=1}^{n} t_{ij}^{b}\ln y_{ij} + \frac{a}{n}\sum_{j=1}^{n} t_{ij}^{b}\overline{\ln}y_i\right]}{\sqrt{\sum_{j=1}^{n}\left\{[at_{ij}^{b}]^2 + \left[\frac{a}{n}\sum_{j=1}^{n} t_{ij}^{b}\right]^2 - 2at_{ij}^{b}\frac{a}{n}\sum_{j=1}^{n} t_{ij}^{b}\right\} \times \sum_{j=1}^{n}\left\{[\ln y_{ij}]^2 + [\overline{\ln}y_i]^2 - 2\ln y_{ij}\overline{\ln}y_i\right\}}}$$

s.t. $0 \leq C_i \leq 1$

The model parameters a and b are obtained to be 1.08 and 1.78, respectively, and the time conversion model is thus as follows:

$$\rho(t) = a \times t^b = 1.08 \times t^{1.78}.$$

Then, model validation is performed. The conversion factors for product performance degradation are shown in Table 3 below, in which Model 5 passes the model validation. In the same way, the analysis is performed for Model 1, Model 2, Model 3 and Model 4, which all pass the validation.

TABLE 3

Validation of time conversion model

| Product No. | Conversion factor $C_i$ | Threshold of conversion factor $C_L$ | Passing validation or not |
|---|---|---|---|
| 1 | 0.9846 | 0.7645 | Passed |
| 2 | 0.9807 | 0.7645 | Passed |
| 3 | 0.9621 | 0.7645 | Passed |
| 4 | 0.9734 | 0.7645 | Passed |
| 5 | 0.9983 | 0.7645 | Passed |
| 6 | 0.9918 | 0.7645 | Passed |
| 7 | 0.9750 | 0.7645 | Passed |
| 8 | 0.9906 | 0.7645 | Passed |
| 9 | 0.9685 | 0.7645 | Passed |
| 10 | 0.9034 | 0.7645 | Passed |

Finally, model selection is performed. The sum of conversion factors $$\sum_{i=1}^{m} C_i$$

for each time conversion model is shown in Table 4 below. Model 5 has the largest sum of conversion factors, and is therefore the optimal time conversion model for the product.

TABLE 4

Selection of time conversion models

| No. | Model | Sum of conversion factors $\Sigma_{i=1}^{m} C_i$ |
|---|---|---|
| 1 | Model 1 | 9.3764 |
| 2 | Model 2 | 9.3186 |
| 3 | Model 3 | 9.1788 |
| 4 | Model 4 | 9.6019 |
| 5 | Model 5 | 9.7284 |

Consequently, the target time conversion model for this product is as follows:

$$\rho(t) = 1.08 \times t^{1.78}$$

b) Nonlinear Wiener Process Analysis

The nonlinear Wiener process for the product is obtained as follows:

$$y(t) = \mu \times 1.08 \times t^{1.78} + \sigma \times Q(1.08 \times t^{1.78})$$

The product reliability function of the product is obtained as follows:

$$R(t) = \Phi\left(\frac{D - \eta \times 1.08 \times t^{1.78}}{\sqrt{\sigma^2 \times 1.08 \times t^{1.78} + \sigma_\eta^2 \times 1.166 \times t^{3.56}}}\right) -$$

$$\exp\left(\frac{2\eta D\sigma^2 + 2\sigma_\eta^2 D^2}{\sigma^4}\right) \cdot \Phi\left(-\frac{2\sigma_\eta^2 D \times 1.08 \times t^{1.78} + \sigma^2(D + \eta \times 1.08 \times t^{1.78})}{\sigma^2 \sqrt{\sigma^2 \times 1.08 \times t^{1.78} + \sigma_\eta^2 \times 1.166 \times t^{3.56}}}\right)$$

The nonlinear Wiener process parameters $\eta$, $\sigma_\eta$, $\sigma$ of the product are obtained by solving the maximum likelihood function.

c) Reliability Test

The mean time between failures MTBF of the product under an acceleration stress is as follows:

$$MTBF = \int_0^{+\infty} R(t)dt = 3547 \text{ h}.$$

The product has an acceleration factor of 9.6 under the acceleration heat stress at a high temperature of 80° C. Therefore, the mean time between failures $MTBF_0$ of the product under the normal stress is obtained as follows:

$$MTBF_0 = A \times MTBF = 34051 h$$

d) Results Analysis

Based on the conventional nonlinear Wiener process, accelerated degradation test data is analyzed using a specific time conversion model (Model 1), and the mean time between failures is 33,173 hours. The actual mean time between failures of the product in use is 35,021 hours. The errors of the estimation result obtained by the method of the present disclosure and the estimation result obtained by the conventional method are 2.77% and 5.28%, respectively. Therefore, the accuracy of the method for processing accelerated degradation test data based on Wiener process provided in this disclosure is higher.

It should be understood that although the various steps in the flowcharts of the embodiments described above are shown in a sequence indicated by the arrows, these steps are not necessarily executed in the order indicated by the arrows. Unless otherwise specified in this document, there is no strict order limitation on the execution of these steps, which can be executed in other orders. Moreover, at least some of the steps in the flowcharts of the embodiments described above may include multiple steps or stages, which may not necessarily be completed at the same time, but can be executed at different times. The execution order of these steps or stages may also not be sequential, but may alternate with at least some of the steps or stages in other steps.

Based on the same inventive concept, the present disclosure also provides a device for processing accelerated degradation test data based on Wiener process to implement the above-mentioned method. The implementations provided by the device for solving the problem are similar to those described in the above method. Therefore, the specific limitations in one or more embodiments of the device for processing accelerated degradation test data based on Wiener process provided below can refer to the limitations on the method for processing accelerated degradation test data based on Wiener process described above and will not be repeated here.

Figure 5:
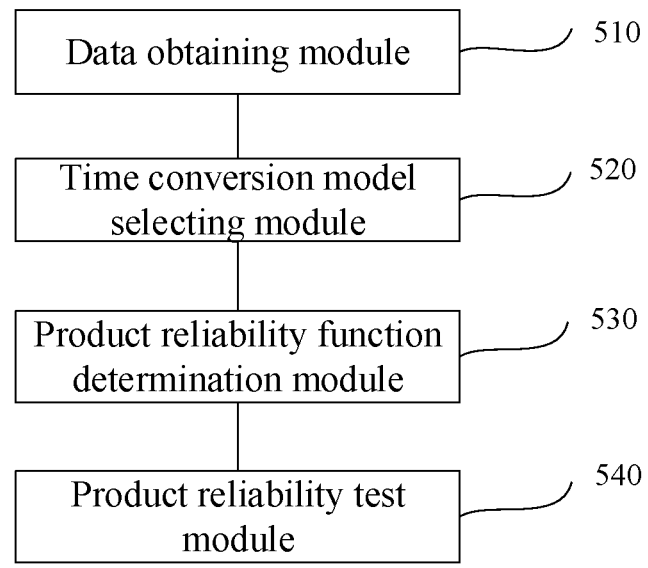
FIG. 5 shows a structural diagram of a device for processing accelerated degradation test data based on Wiener process according to an embodiment.

In an embodiment, as shown in FIG. 5, a device for processing accelerated degradation test data based on Wiener process is provided, which includes a data obtaining module 510, a time conversion model selecting module 520, a product reliability function determination module 530, and a product reliability test module 540.

The data obtaining module 510 is configured to obtain accelerated degradation test data of to-be-tested products.

The time conversion model selecting module 520 is configured to select a target time conversion model from a predefined set of time conversion models based on the accelerated degradation test data.

The product reliability function determination module 530 is configured to construct a nonlinear Wiener process based on the target time conversion model, and determine a product reliability function for the to-be-tested products accordingly.

The product reliability test module 540 is configured to test the reliabilities of the to-be-tested products based on the product reliability function, and obtain product reliability test results of the to-be-tested products.

In the above-described device for processing accelerated degradation test data based on Wiener process, accelerated degradation test data of the to-be-tested products is obtained. Based on the accelerated degradation test data, a target time conversion model is selected from a predefined set of time conversion models. Then, a nonlinear Wiener process is constructed based on the target time conversion model and a product reliability function of the product is determined accordingly. Finally, the reliability of the to-be-tested product is tested based on the product reliability function to obtain a product reliability test result. Firstly, the device considers that degradation time may follow different conversion models and thus conducts a model selection from a set of time conversion models, thereby providing effective support for accurate reliability tests. Secondly, the construction of a nonlinear Wiener process based on the selected target time conversion model takes into account the nonlinearity of performance degradation, and is thus comprehensive. Thirdly, the product reliability function determined based on the nonlinear Wiener process allows for accurate reliability tests of the to-be-tested product. In summary, the method enables accurate product reliability tests.

In an embodiment, the product reliability function determination module 530 is further configured to construct an initial nonlinear Wiener process based on the target time conversion model, construct an initial product reliability function based on the initial nonlinear Wiener process, estimate nonlinear Wiener process parameters of the initial product reliability function, and determine the product reliability function of the to-be-tested products accordingly.

In an embodiment, the product reliability function determination module 530 is further configured to obtain a failure probability density function of the to-be-tested product based on the initial product reliability function, determine nonlinear Wiener process parameters of the initial product reliability function based on a pre-constructed maximum likelihood function of performance degradation, the initial product reliability function, and the failure probability density function, and determine the product reliability function for the to-be-tested products.

In an embodiment, the product reliability test module 540 is further configured to test the reliability of the to-be-tested product under multiple accelerated degradation test stresses based on the product reliability function to obtain a first mean time between failures of the to-be-tested product, and obtain a second mean time between failures of the to-be-tested product under a normal stress based on the first mean time between failures and an acceleration factor corresponding to a target accelerated degradation test stress.

In an embodiment, the time conversion model selecting module 520 is further configured to determine time conversion factors of each to-be-tested product based on the accelerated degradation test data, transform the time conversion models in the set of time conversion models into non-linear optimization equations based on the time conversion factors, estimate model parameters of each time conversion model, determine respective time conversion models based on the model parameters, and select the target time conversion model from the set of time conversion models based on the time conversion factors of the to-be-tested product.

In an embodiment, the time conversion model selecting module 520 is further configured to validate the time conversion models based on the respective conversion factors of each to-be-tested product to obtain model validation results, select the initial time conversion models from the time conversion models based on the model validation results, and select the target time conversion model from the initial time conversion models based on the time conversion factors corresponding to the initial time conversion models.

The various modules in the above device for processing accelerated degradation test data based on Wiener process can be fully or partially implemented through software, hardware, or a combination thereof. These modules can be embedded in hardware within or independent of processors in computer devices, or they can be stored in software form in the memory of computer devices, enabling processors to call and execute the corresponding operations of these modules.

Figure 6:
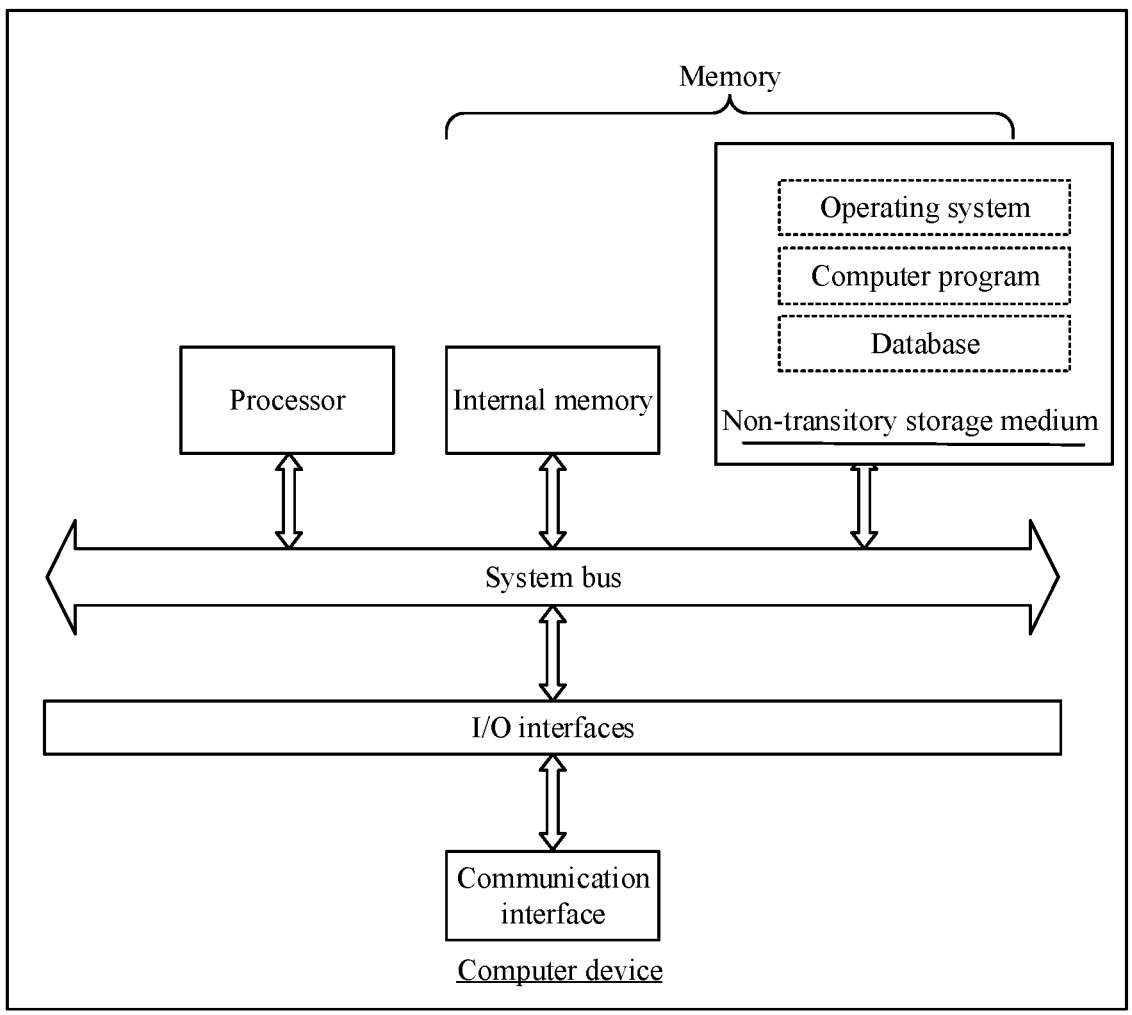
FIG. 6 is a diagram illustrating the internal structure of a computer device according to an embodiment.

In an embodiment, a computer device is provided, which can be a server, and its internal structure diagram is shown in FIG. 6. The computer device includes a processor, a memory, input/output interfaces (I/O), and a communication interface. The processor, memory, and input/output interfaces are connected via a system bus, and the communication interface is connected to the system bus through the input/output interfaces. The processor of the computer device is configured to provide computing and control functions. The memory of the computer device includes a non-transitory storage medium and an internal memory. The non-transitory storage medium stores an operating system, a computer program, and databases. The internal memory provides an environment for running the operating system and the computer program stored in the non-transitory storage medium. The database of the computer device is configured to store accelerated degradation test data and product reliability test results. The input/output interfaces of the computer device are used to exchange information between the processor and external devices. The communication interface of the computer device is configured to communicate with external devices via a network. When executed by the processor, the computer program causes the processor to carry out a method for processing accelerated degradation test data based on Wiener process.

It will be understood by those skilled in the art that the structure illustrated in FIG. 6, which is only a block diagram of a portion of the structure related to the embodiments of the present disclosure, does not constitute a limitation on the computer device to which the solution of the present disclosure is applied, and that a specific computer device may include more or fewer components than those shown in the drawings, or may combine some of the components, or may have a different arrangement of components.

In an embodiment, a computer device including a memory and a processor is provided. The memory stores a computer program. The processor, when executing the computer program, carries out the steps of the above-described method for processing accelerated degradation test data based on Wiener process.

In an embodiment, a non-transitory computer-readable storage medium having a computer program stored thereon is provided. The computer program, when executed by a processor, causes the processor to carry out the steps of the above-described method for processing accelerated degradation test data based on Wiener process.

In an embodiment, a computer program product including a computer program is provided. The computer program, when executed by a processor, causes the processor to carry out the steps of the above-described method for processing accelerated degradation test data based on Wiener process.

The user information involved in this disclosure, including but not limited to user device information, user personal information, etc., as well as the data used for analysis, storage, display, etc., are all information and data authorized by the user or fully authorized by all parties, and the collection, use, and processing of related data must comply with relevant national and regional laws, regulations, and standards.

An ordinary person skilled in the art should understand that the entire or partial process of implementing the above-mentioned embodiments can be instructed by a computer program to be completed by the relevant hardware. The computer program can be stored in a non-transitory computer-readable storage medium, and when executed, may include the processes of the embodiments as described above. In the various embodiments provided in this disclosure, any reference to storage, database, or other medium may include at least one of non-transitory and transitory storage. Non-transitory storage may include read-only memory (ROM), magnetic tape, floppy disk, flash memory, optical storage, high-density embedded non-transitory storage, resistive random-access memory (ReRAM), magnetoresistive random-access memory (MRAM), ferroelectric random-access memory (FRAM), phase-change memory (PCM), graphene memory, etc. Transitory memory may include random access memory (RAM) or external high-speed cache memory. As an illustration and not a limitation, RAM may come in various forms, such as static random-access memory (SRAM) or dynamic random-access memory (DRAM), etc. The databases involved in the various embodiments provided in this disclosure may include at least one of a relational database and a non-relational database. Non-relational databases may include distributed databases based on blockchain, etc., not limited to this. The processors involved in the various embodiments provided in this disclosure may be general-purpose processors, central processors, graphic processors, digital signal processors, programmable logic devices, logic devices based on quantum computing, etc., not limited to this.

The various technical features of the embodiments described above can be combined arbitrarily. For the sake of brevity, not all possible combinations of the various technical features in the above embodiments have been described. However, as long as the combination of these technical features is not contradictory, it should be considered within the scope of this specification.

The above-described embodiments only express some embodiments of the present disclosure, which are described in a relatively specific and detailed manner, but this should not be understood as limiting the protecting scope of the present disclosure. It should be noted that for those skilled in the art, various modifications and improvements can still be made, without departing from the concept of the present disclosure, and these modifications and improvements are all within the protection scope of the present disclosure.

Therefore, the protection scope of the present disclosure should be determined by the claims attached hereto.

What is claimed is:

1. A method for processing accelerated degradation test data based on Wiener process, comprising:
   constructing a nonlinear Wiener degradation process based on a target-time conversion model, and determining a product reliability function for the to-be-tested products based on the nonlinear Wiener degradation process; and
   testing reliabilities of the to-be-tested products based on the product reliability function, and obtaining product reliability test results of the to-be-tested products to provide information of the to-be-tested product lifespan;
   wherein the product reliability test results include a mean time between failures to indicate the to-be-tested products' quality over time and ability to maintain functionality within a specified time period;
   wherein the product reliability test result further comprises a first mean time between failures and a second mean time between failures; and
   wherein the testing the reliabilities of the to-be-tested products based on the product reliability function, and obtaining the product reliability test results of the to-be-tested products comprises:
   testing the reliability of each to-be-tested product under multiple accelerated degradation test stresses based on the product reliability function, and obtaining the first mean time between failures of the to-be-tested product; and obtaining the second mean time between failures of the to-be-tested product under a normal stress based on the first mean time between failures and an acceleration factor corresponding to a target accelerated degradation test stress.

2. The method of claim 1, wherein the constructing the nonlinear Wiener degradation process based on the target time conversion model, and determining the product reliability function for the to-be-tested products based on the nonlinear Wiener degradation process comprises:
   constructing an initial nonlinear Wiener process based on the target time conversion model;
   constructing an initial product reliability function based on the initial nonlinear Wiener process; and
   estimating nonlinear Wiener process parameters of the initial product reliability function to determine the product reliability function for the to-be-tested products.

3. The method of claim 2, wherein the estimating the nonlinear Wiener process parameters of the initial product reliability function to determine the product reliability function for the to-be-tested products comprises:
   obtaining a failure probability density function of the to-be-tested products based on the initial product reliability function; and
   estimating the nonlinear Wiener process parameters of the initial product reliability function based on a pre-constructed maximum likelihood function of performance degradation, the initial product reliability function, and the failure probability density function to determine the product reliability function for the to-be-tested product.

4. The method of claim 1, wherein a method for obtaining the target time conversion model comprises:
   obtaining accelerated degradation test data of to-be-tested products, the accelerated degradation test data comprising multiple accelerated degradation test stresses;
   determining time conversion factors of each to-be-tested products, the accelerated degradation test data, transforming time conversion models in a predefined set of time conversion models into nonlinear optimization equations based on the time conversion factors, estimating model parameters of each time conversion model, determining the time conversion models based on the model parameters, performing model validations for the time conversion models based on the time conversion factors of the to-be-tested products and preset conversion factor validation thresholds, and selecting the target time conversion model from the time conversion models based on model validation results, the target time conversion model representing a pattern of performance degradation over time.

5. The method of claim 4, wherein the selecting the target time conversion model from the time conversion models based on the model validation results comprises:
   selecting initial time conversion models from the time conversion models based on the model validation results; and
   selecting the target time conversion model from the initial time conversion models based on time conversion factors corresponding to the initial time conversion models.

6. A device for processing accelerated degradation test data based on Wiener process, comprising:
   a product reliability function determination module configured to construct a nonlinear Wiener process based on a target time conversion model and determine a product reliability function for the to-be-tested products based on the nonlinear Wiener degradation process; and
   a product reliability test module configured to test reliabilities of the to-be-tested products based on the product reliability function and obtain product reliability test results of the to-be-tested products to provide information of the to-be-tested product lifespan;
   wherein the product reliability test results include a mean time between failures to indicate the to-be-tested products' quality over time and ability to maintain functionality within a specified time period;
   wherein the product reliability test result further comprises a first mean time between failures and a second mean time between failures; and
   wherein the testing the reliabilities of the to-be-tested products based on the product reliability function, and obtaining the product reliability test results of the to-be-tested products comprises:
   testing the reliability of each to-be-tested product under multiple accelerated degradation test stresses based on the product reliability function, and obtaining the first mean time between failures of the to-be-tested product; and obtaining the second mean time between failures of the to-be-tested product under a normal stress based on the first mean time between failures and an acceleration factor corresponding to a target accelerated degradation test stress.

7. The device of claim 6, wherein the product reliability function determination module is configured to:
   construct an initial nonlinear Wiener process based on the target time conversion model;
   construct an initial product reliability function based on the initial nonlinear Wiener process; and estimate nonlinear Wiener process parameters of the initial product reliability function to determine the product reliability function for the to-be-tested products.

8. The device of claim 7, wherein the product reliability function determination module is further configured to:
obtain a failure probability density function of the to-be-tested products based on the initial product reliability function; and
estimate the nonlinear Wiener process parameters of the initial product reliability function based on a pre-constructed maximum likelihood function of performance degradation, the initial product reliability function, and the failure probability density function to determine the product reliability function for the to-be-tested products.

9. A computer device, comprising a memory and a processor, the memory storing a computer program, wherein the processor, when executing the is computer program, carries out steps of the method according to claim 1.

10. A non-transitory computer readable storage medium having a computer program stored thereon, wherein the computer program, when executed by a processor, causes the processor to carry out steps of the method according to claim 1.

11. The device of claim 6, further comprising:
a data obtaining module configured to obtain accelerated degradation test data of to-be-tested products, the accelerated degradation test data comprising multiple accelerated degradation test stresses;
a time conversion model selecting module configured to determine time conversion factors of each to-be-tested product based on the accelerated degradation test data, transform time conversion models in a predefined set of time conversion models into nonlinear optimization equations based on the time conversion factors, estimate model parameters of each time conversion model, determining the time conversion models based on the model parameters, perform model validations for the time conversion models based on the conversion factors of the to-be-tested products and preset conversion factor validation thresholds, and select the target time conversion model from the time conversion models based on the model validation results, the target time conversion model representing a pattern of performance degradation over time.

* * * * *